(12) United States Patent
Schrott et al.

(10) Patent No.: US 6,333,543 B1
(45) Date of Patent: Dec. 25, 2001

(54) FIELD-EFFECT TRANSISTOR WITH A BURIED MOTT MATERIAL OXIDE CHANNEL

(75) Inventors: Alejandro G. Schrott, New York; James A. Misewich, Peakskill; Bruce A. Scott, Pleasantville, all of NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/268,633

(22) Filed: Mar. 16, 1999

(51) Int. Cl.[7] .................. H01L 19/12; H01L 31/119; H01L 31/062; H01L 29/76; H01L 29/94; H01L 31/113
(52) U.S. Cl. .................. 257/410; 257/43; 257/289
(58) Field of Search .................. 257/410–414, 257/382–384, 38–39, 286, 40, 43; 438/85, 86, 104

(56) References Cited

U.S. PATENT DOCUMENTS

| | | | |
|---|---|---|---|
| 5,401,714 | * | 3/1995 | Chaudhari et al. .............. 257/38 |
| 5,571,337 | * | 11/1996 | Sheu et al. .............. 438/161 |
| 5,652,156 | * | 7/1997 | Liao et al. .............. 438/291 |
| 6,121,642 | * | 9/1990 | Newns .............. 257/192 |
| 6,259,114 | * | 7/2001 | Misewich et al. .............. 257/43 |

FOREIGN PATENT DOCUMENTS

| | | | |
|---|---|---|---|
| 08274195A | * | 10/1996 | (JP) . |
| 410056177A | * | 2/1998 | (JP) . |
| 02000294796A | * | 10/2000 | (JP) . |
| 02000332133A | * | 11/2000 | (JP) . |

OTHER PUBLICATIONS

Mott Transition field effect transition D. M. Newns Applied physics letters vol. 73 No. 6 pp. 780–782.*

* cited by examiner

Primary Examiner—Tom Thomas
Assistant Examiner—Cuong Q Nguyen
(74) Attorney, Agent, or Firm—McGinn & Gibb, PLLC; Marian Underweiser, Esq.

(57) ABSTRACT

A structure and method of forming an integrated circuit (e.g., field effect transistor) having a buried Mott-insulated oxide channel includes depositing source and drain electrodes over a substrate forming a Mott transition channel layer over the substrate and electrodes, forming an insulator layer over the Mott transition channel layer, forming source and drain contacts through the insulator layer (such that the source and drain contacts are electrically connected to the Mott transition channel layer) and forming a gate electrode over the insulator layer between the source and drain contacts.

21 Claims, 6 Drawing Sheets

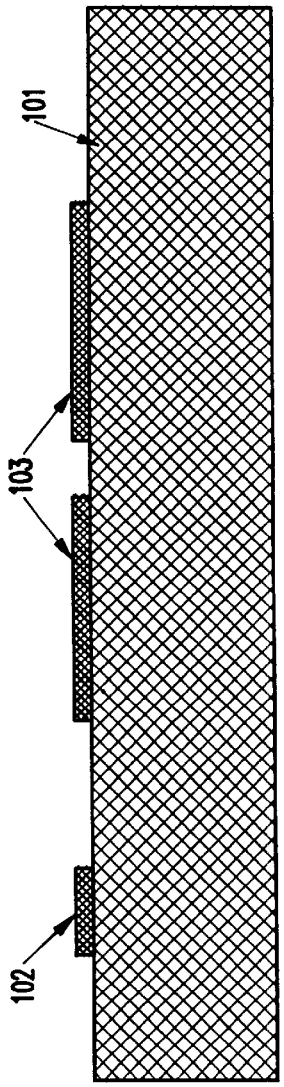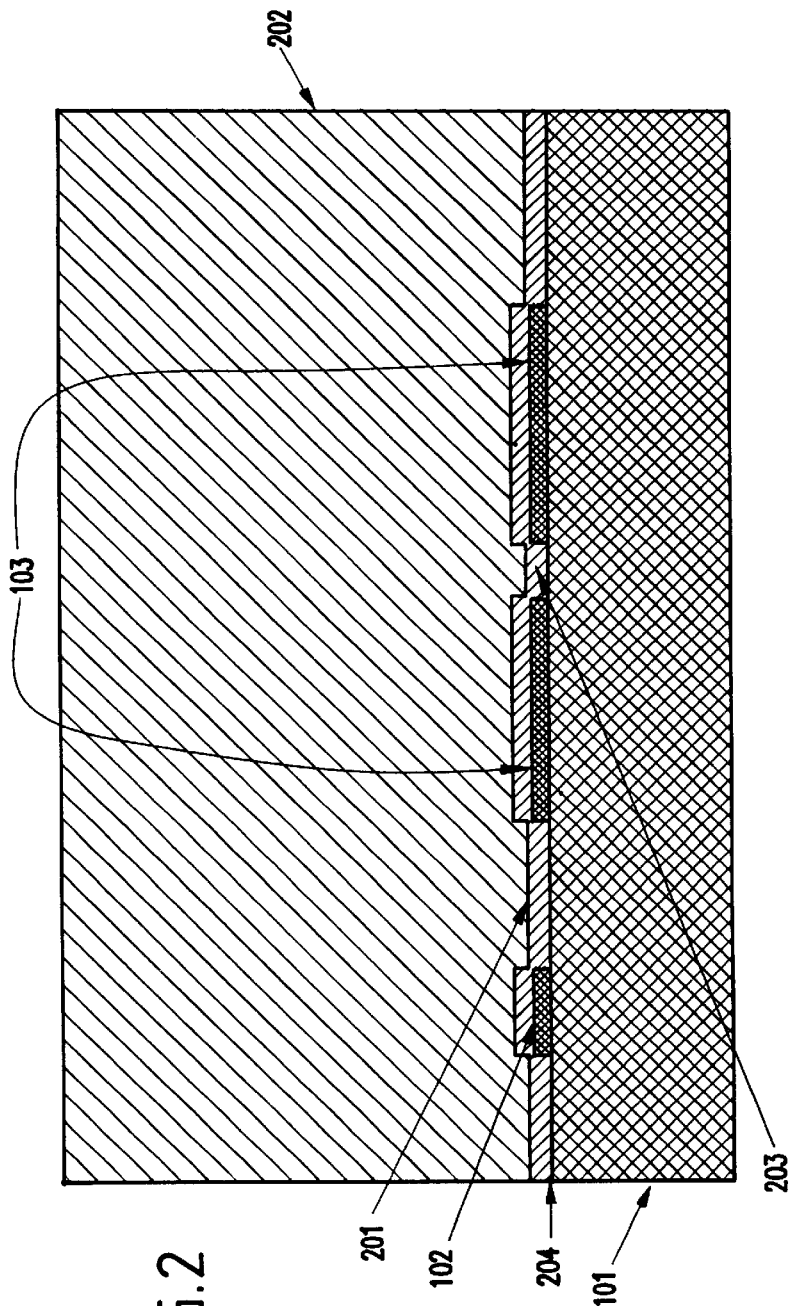

FIELD-EFFECT TRANSISTOR WITH A BURIED MOTT MATERIAL OXIDE CHANNEL

BACKGROUND OF THE INVENTION

1. Field of the Invention

The present invention generally relates to integrated circuits and, more specifically to a transistor having a buried Mott material oxide channel.

2. Description of the Related Art

Silicon based metal oxide semiconductor field effect transistors (MOSFETs) are reaching the limits of scaling (e.g., reduction in size) due to, among other things, doping and double depletion effects. In other words, as semiconductor devices are reduced in size, the depletion regions are placed in closer proximity to one another. This often results in merging or shorting of the adjacent depletion regions.

Silicon MOSFET technology is expected to scale to 0.1 micron channel length devices after the year 2000. Below 0.1 microns however, there are fundamental physical effects which can limit silicon MOSFET technology, including: short channel effects, dopant number fluctuations, ballistic transport and tunneling through thin gate oxides. These effects may limit the minimum channel length in silicon MOSFET technology to an estimated 30 nm.

One solution to the scaling problem is a field effect transistor (FET) formed with a channel oxide capable of undergoing a metal-insulator transition known as a Mott transition (e.g., a Mott FET or MTFET).

A Mott FET is a solid state switching device made entirely of oxide materials and is discussed in more detailed in Mott Transition Field Effect Transistor, Newns, et al. Applied Physics Letters, Vol 73, Number 6, pages 780–782, Aug. 10, 1998, incorporated herein by reference. The Mott FET device includes a channel connecting source and drain electrodes, a gate oxide and a gate electrode.

For example, a Mott FET device is shown in FIG. 8. The device includes a conductive substrate 80 (e.g., Nb-STO (100)-cut crystal) which forms the gate electrode, a gate oxide layer 81 (e.g., strontium titanate (STO)) epitaxially grown on the substrate 80, a Mott conductor-insulator transition channel 82 (e.g., an epitaxially grown cuprate material such as $Y_{1-x}Pr_xBa_2Cu_3O_{7-\delta}$ (YPBCO, LCO)), source and drain electrodes 83 and an isolation trench 84. With the structure shown in FIG. 8, when a voltage is applied to the gate 81, the channel 82 changes from an insulator to a conductor (or vice versa) to make or break a connection between the source and drain 83.

The Mott FET device is quite distinct from conventional silicon metal oxide field effect transistors in that the channel is a Mott oxide, a material with a characteristic, controllable, metal-insulator transition, rather than a semiconductor. A Mott FET device offers significant potential for scaling to the nanometer dimensions for integration with ferroelectric materials in non-volatile storage roles and for fabrication of multilayer device structures. Mott FET devices remain adequate on a nanoscopic scale which is well beyond the current projected limits of silicon MOSFET scaling.

However, the conventional Mott FET has a number of limitations. Specifically, the structure shown in FIG. 8 results in the channel layer 82 being exposed to subsequent processing steps, which may damage or undesirably change the channel layer 82. Further, the epitaxially grown gate oxide 81 provides a somewhat imperfect surface upon which to grow the Mott transition channel layer 82, which limits the scaling which can be achieved with conventional Mott FETs.

SUMMARY OF THE INVENTION

It is, therefore, an object of the present invention to provide a structure and method for an integrated circuit (e.g., field effect transistor) having a buried Mott-insulated oxide channel. The inventive method includes depositing source and drain electrodes onto the substrate, forming a Mott transition channel layer over a substrate, forming an insulator layer over the Mott transition channel layer, forming source and drain contacts through the insulator layer (such that electrical contact is made to the Mott transition channel layer) and forming a gate conductor electrode over the insulator layer between the source and drain electrodes.

The inventive method also includes, before the forming of the Mott transition channel layer, cleaning the substrate, wherein the cleaning comprises ultrasound-cleaning using at least one of acetone, isopropanol, and ethanol, in successive stages. After the cleaning, the method includes performing an $O_2$ ash on the substrate.

The forming of the Mott transition channel layer can include epitaxially forming the Mott transition channel layer and the Mott transition channel layer may comprise a peroskvite oxide layer.

In accumulation type devices, the spacing of the source and drain electrodes defines the channel length. Whereas, in depletion type devices, the channel region is defined by the area under the gate electrode. The method also includes adjusting the conductivity of the channel layer by increasing or decreasing an oxygen content of the channel layer.

The integrated circuit device of the invention includes a Mott transition channel layer over a substrate, an insulator layer over the Mott transition channel layer, source and drain contacts through the insulator layer (to connect to source and drain electrodes that are electrically connected to the Mott transition channel layer) and a gate conductor electrode over the insulator layer between the source and drain electrodes.

The Mott transition channel layer may be an epitaxially formed Mott transition channel layer, including a peroskvite oxide layer. The spacing of the source and drain electrodes is defined by the gate channel length in accumulation devices and by the gate electrode length in depletion devices. The conductivity of the channel layer is adjusted by increasing or decreasing an oxygen content of the channel layer.

With the invention, the Mott transition channel layer is buried below the gate oxide layer which protects the channel layer from damage or change during subsequent processing. Also, the invention forms the channel layer on a clean substrate using an epitaxial growth process, which provides superior long-range order quality and fewer imperfections when compared to conventional structures. Additionally, the length of the channel region is easily controlled with the invention during the patterning of the conductive contacts.

BRIEF DESCRIPTION OF THE DRAWINGS

The foregoing and other objects, aspects and advantages will be better understood from the following detailed description of preferred embodiments of the invention with reference to the drawings, in which:

FIG. 1 is a schematic diagram of a cross-sectional view of a partially completed transistor according to the invention;

FIG. 2 is a schematic diagram of a cross-sectional view of a partially completed transistor according to the invention;

DETAILED DESCRIPTION OF PREFERRED EMBODIMENTS OF THE INVENTION

Figure 3:
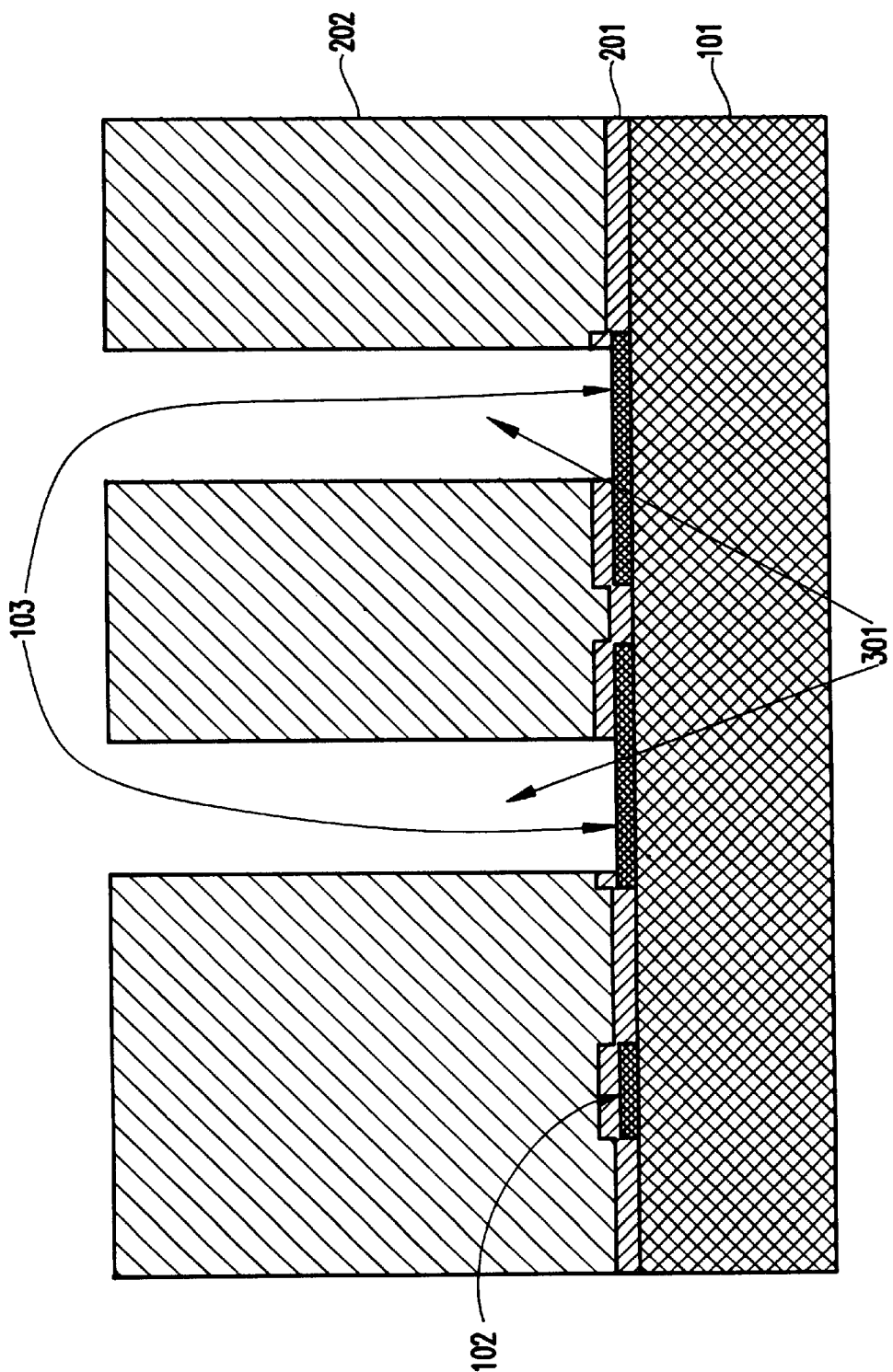
FIG. 3 is a schematic diagram of a cross-sectional view of a partially completed transistor according to the invention.

The invention overcomes the foregoing problem of fabricating a Mott-FET device and allows the use of state of the art lithographic techniques, while preserving ideal conditions for epitaxial growth.

Preserving ideal conditions for epitaxial growth of the Mott transition channel layer is important because atomic control is needed to fabricate current oxide-channel devices. In particular the channel layer is one element that requires the highest degree of long range order and the lowest density of imperfections. Desirable conditions for good epitaxial growth of the channel layer include a flat single-crystal substrate with a good lattice match. The gate insulator, requires a lesser degree of lattice perfection and can be deposited after the channel layer. Therefore, the invention forms a buried Mott transition channel layer using a special process to provide for the channel definition and for the necessary contacts to buried source and drain regions.

The invention provides atomic control by epitaxially growing the channel layer onto a flat single-crystal surface. More specifically, the invention uses a process that defines the channel size, provides the necessary contacts to the buried source and drain and top gate electrode, and also electrically isolates the devices from one another.

Referring now to FIG. 1, a thin (10–300 nm) conductive material, such as a metal or alloy (e.g., Pt, etc.) is deposited (either by evaporation, sputtering, or other well known deposition process) and patterned (e.g., using common patterning techniques, such as lithographic masking and etching) to form alignment marks 102 and source/drain electrodes 103 for the source and drain on a clean flat single crystal perovskite oxide substrate (e.g., Strontium titanate (STO)) 101. Once the electrodes 103 have been deposited, the sample is thoroughly cleaned to allow epitaxial growth on the regions other than the electrodes 103.

One ordinarily skilled in the art would understand that many different cleaning agents and processes could be used. For example, the sample could be ultrasound-cleaned in acetone, isopropanol, and ethanol, in successive stages. This could be followed by an $O_2$ ash (typically 1 min. at 50 Watts). The cleaned substrate (with the electrodes 103) is then introduced into a deposition chamber for the formation of the Mott transition channel layer 201.

Referring now to FIG. 2, a Mott transition channel layer 201 is epitaxially grown on the substrate 101. The gate channel length is shown as item 203 and is limited by the spacing of the electrodes 103. An important feature of the invention is the channel length is mainly limited by lithography. As would be known by one ordinarily skilled in the art given this disclosure, prior to deposition, the substrate 101 could be degassed in-situ.

In a preferred embodiment, perovskite oxide is used for the channel layer 201 to provide a good lattice match with the substrate 101. While one ordinarily skilled in the art would know (in light of this disclosure) of many perovskite oxides which may be utilized, in a preferred embodiment, materials such as $La_2CuO_4$ or $Y_{1-x}PrBa_2Cu_3O_7$ (where x<1) are used for p-type channels and $Nd_2CuO_4$ is used for n-type channels. The thickness of the channel can be any thickness required by the given design and preferably is about 30–10 nm.

Figure 8:
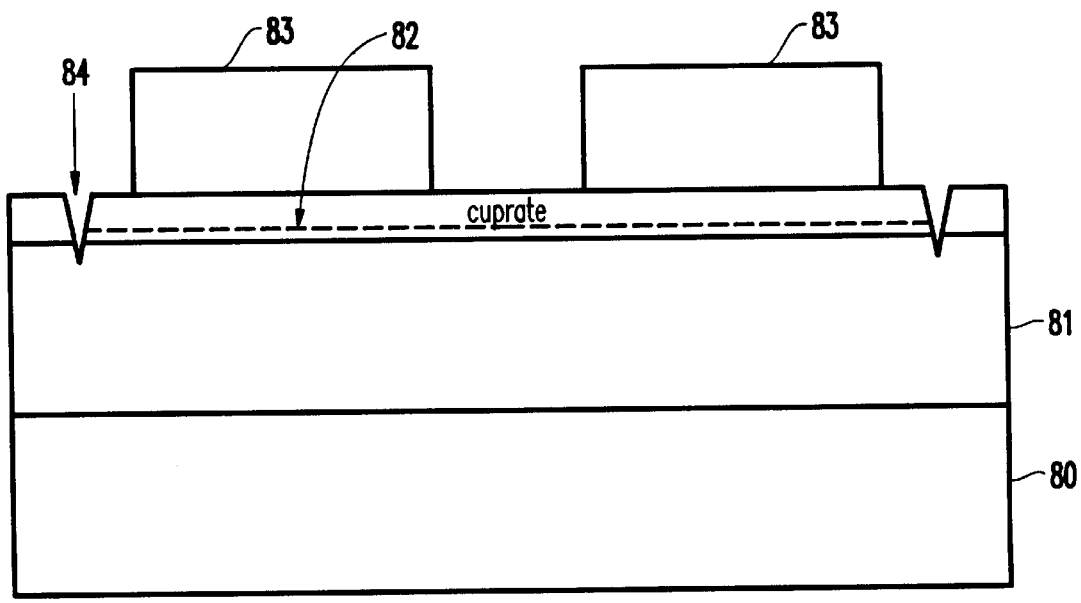
FIG. 8 is a schematic diagram of a conventional Mott FET device.

By epitaxially growing the channel layer 201 on the cleaned, ashed single crystal substrate 101, the atomic control over the channel layer 201 is maximized. Therefore, with the invention the channel layer 201 is provided with the highest degree of long-range order and lowest density of imperfections. Thus, the channel layer 201 of the invention will have substantially less imperfections than the conventional channel layer 82 grown on the epitaxially formed gate oxide 81, shown in FIG. 8.

In an alternative embodiment, the formation of CuO precipitates between the substrate 101 and the channel layer 201 are prevented by depositing a monolayer of SrO 204 onto the substrate 101, prior to the deposition of the channel layer 201.

This inventive process continues with the deposition, without breaking vacuum in the deposition chamber, of the gate-oxide layer 202, which can be any oxide and is preferably $SrTO_3$ (STO) or Ba 1-x Sr x $TiO_3$ (BSTO). The gate oxide layer 202 could be deposited using any of a number of conventional techniques. For example, the gate oxide layer 202 could be deposited by pulsed laser deposition (PLD) using an excimer LASER. Further, the thickness of the gate oxide layer 202 can be adjusted to meet specific design requirements, as would be known by one ordinarily skilled in the art, and preferably ranges from 20 to 200 nm.

In another embodiment, the deposition of the gate insulator 202 could be performed in multiple stages. For example, first, a thin layer of $SrTO_3$ (STO) or Ba 1-x Sr x $TiO_3$ (BSTO) could be formed as described above, to effect a good abrupt interface with the channel layer 201. Then, a second layer of gate oxide could be deposited by the same or another method such as sol-gel. This embodiment allows for more parameters to tailor the dielectric constant and stress of the gate-oxide layer to the designer's requirements.

As shown in FIG. 3, the process continues with the formation of openings of vias 301. As would be known by one ordinarily skilled in the art given this disclosure, the vias 301 could be formed using any number of processes such as ion milling, reactive ion etching or wet etching through a lithographic mask. For example, the selectivity of wet etching allows for a faster and more controlled process. In a preferred embodiment, a solution of diluted (1:50–1:100) HF is used to etch the gate-oxide 202. Due to the selectivity of HF, the channel layer 201 is not etched. Similarly, the process can continue either by dry etching or with a diluted (1:50–1:100) HCl wet etch solution. The Pt electrodes 103 do not react with either the HF or the HCl wet etch solution and, therefore, the etching would automatically stop at the Pt electrodes 103.

The success of the via 301 formation depends on the good adhesion of the lithographic photoresist. This adhesion is enhanced by spinning an adhesion promoter (e.g., AP8000, Dow Chemical, Midland, Mich., U.S.A.) on a freshly ashed oxide surface.

Figure 4:
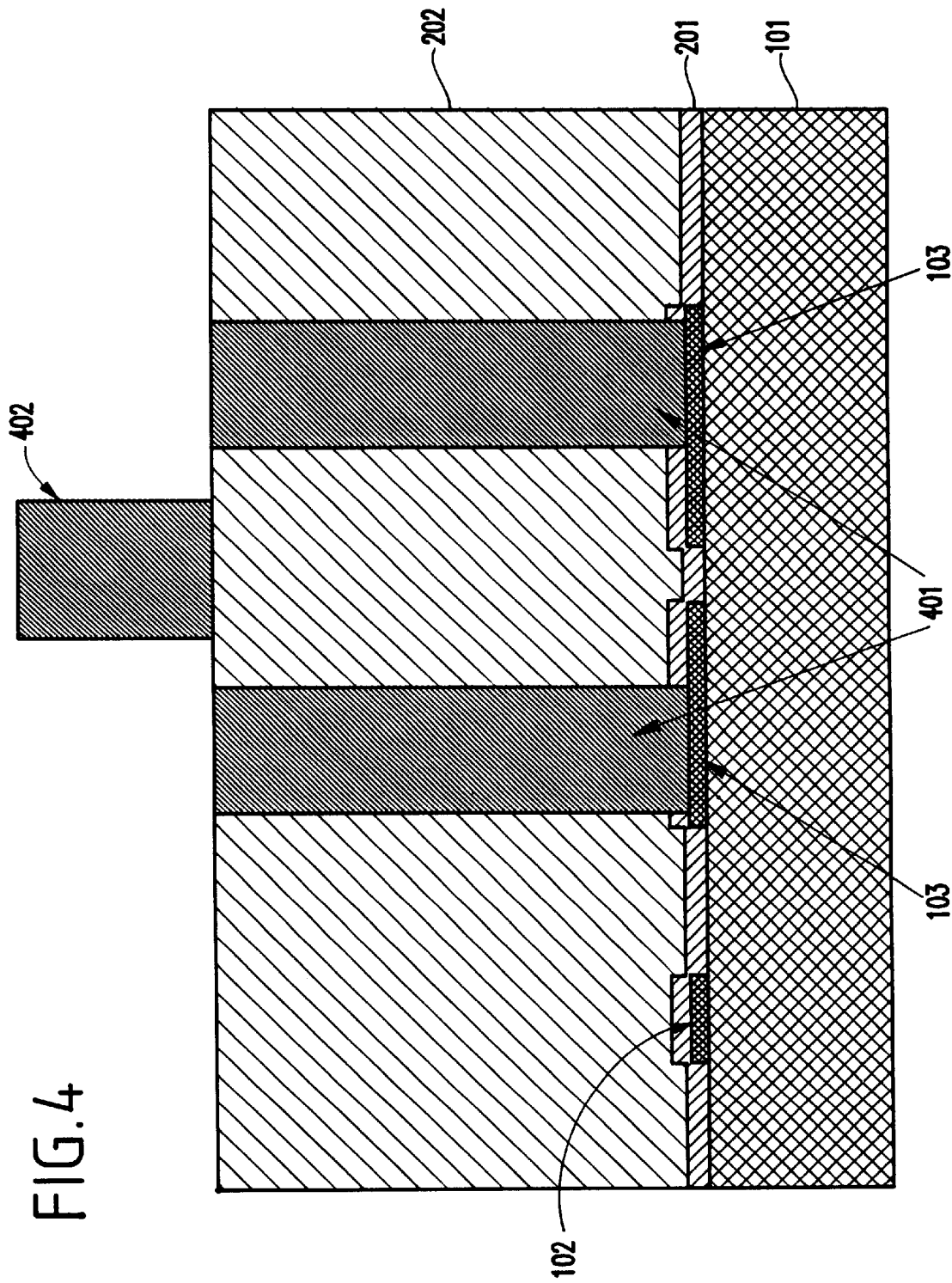
FIG. 4 is a schematic diagram of a cross-sectional view of a partially completed transistor according to the invention.

Once the vias 301 are opened, the electrodes 103 are optionally tested. Then, as shown in FIG. 4, a conductor 401 (such as Pt, etc.) is deposited using conventional well known techniques to form the source and drain contacts. For example, the conductor 401 could be deposited through the same mask used to form the vias 301, in order to fill the vias and establish a conductive path to the electrodes 103.

Then using processes well known to those ordinarily skilled in the art given this disclosure, a gate electrode 402 is patterned. For example, the first mask could be dissolved, another lithographic mask formed and the conductor 402 deposited to define the gate electrode 402, as shown in FIG. 4.

In an alternative embodiment, which does not use the electrodes 103, the contacts 401 could define the source and drain by establishing direct electrical connection with the channel layer 201.

Figure 5:
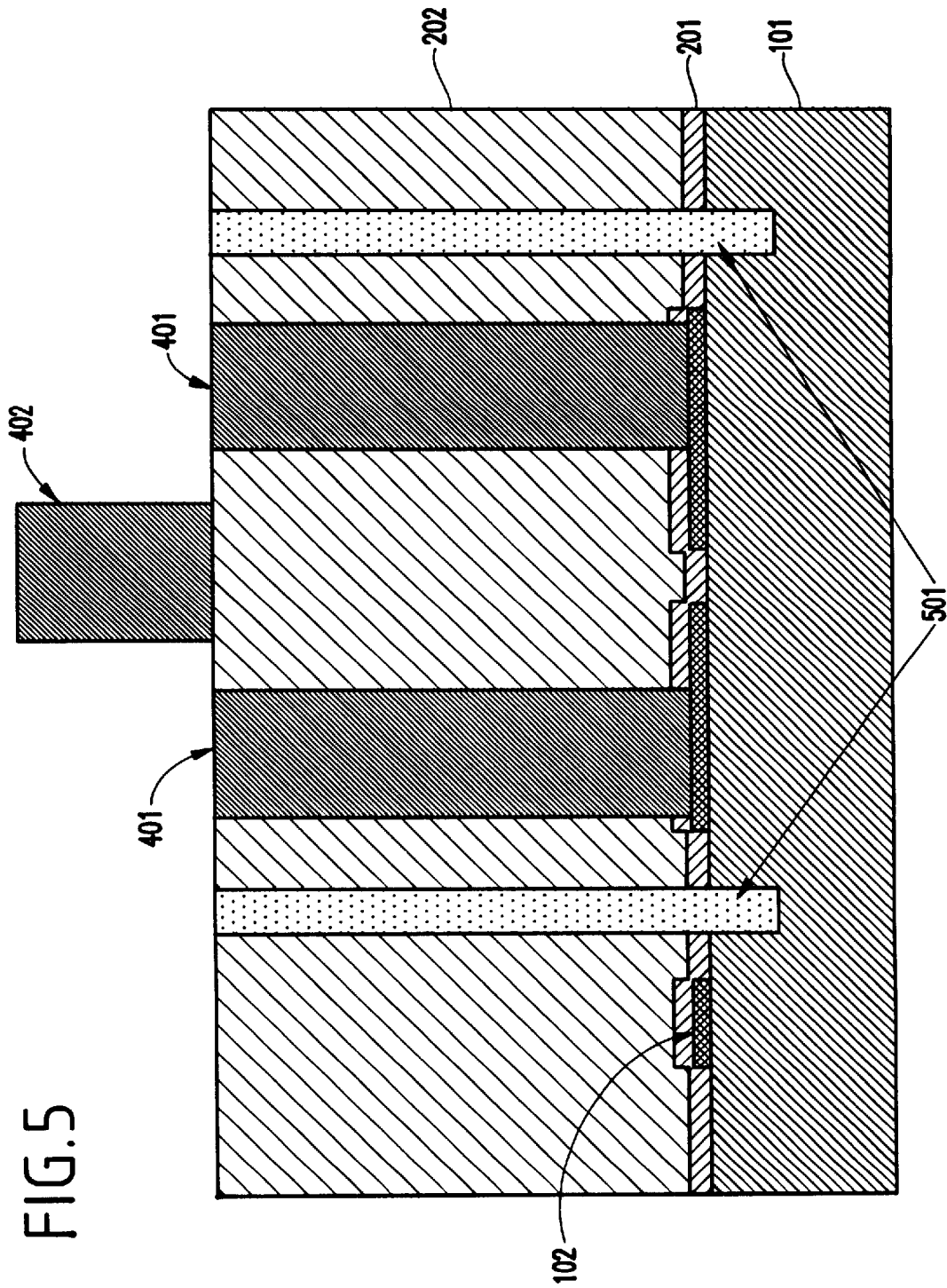
FIG. 5 is a schematic diagram of a cross-sectional view of a completed transistor according to the invention.

The next process isolates each device on the chip. As shown in FIG. 5, isolation region openings 501 are formed, again using conventional masking and etching techniques. Because FIG. 5 is a 2-dimensional figure, the isolation regions 501 are not seen in their full aspect.

The conductivity of the channel layer 201 can be modified by changing its oxygen content. This is accomplished by annealing the sample in either an oxygen atmosphere, for an oxygen increase, or in a noble gas (or vacuum) atmosphere for an oxygen decrease.

The oxygen diffuses through the gate oxide 202 at high temperatures (e.g., 700° C.). Further, oxygen defuses directly through the channel layer 201 through the isolation region openings 501. After the oxygen content of the channel layer is modified, the openings 501 may be filled with an isolation material 501 to further electrically isolate adjacent devices and to cap the channel region.

In operation, the conductivity the of the channel layer 201 is altered by applying a voltage to the gate electrode 402. A p-type channel layer 201 which has a low oxygen content (e.g., a p-type accumulation device) will have a low number of carriers (e.g., holes) and will be an insulator. The low oxygen channel layer 201 becomes a conductor when a negative voltage is supplied to the gate 402

In a complementary arrangement, a p-type channel layer 201 having a high oxygen content (e.g., a p-type depletion device) will have a high number of carriers and will be a conductor (absent an electrical charge in the gate). Similarly, when a positive voltage is applied to the gate 402, the high oxygen content channel layer 201 will become an insulator.

An n-type channel layer 201 (e.g., an n-type accumulation device) which has a high oxygen content will have a low number of carriers (electrons) and will be an insulator. The high oxygen channel layer 201 becomes a conductor when the positive voltage is supplied to the gate 402.

In a complementary arrangement, a n-type channel layer 201 having a low oxygen content (e.g., an n-type depletion device) will have a high number of carriers and will be a conductor (absent an electrical charge in the gate). Similarly, when a negative voltage is applied to the gate 402, the low oxygen content channel layer 201 will become an insulator.

For accumulation devices the region in the channel film between source and drain electrodes needs to be metallized by the application of the gate voltage. Otherwise, a resistor in series will be formed and limit the performance of the device. To the contrary, for depletion devices only a small length of the channel film needs to become an insulator upon application of the gate field in order to interrupt the flow of carriers.

Figure 6:
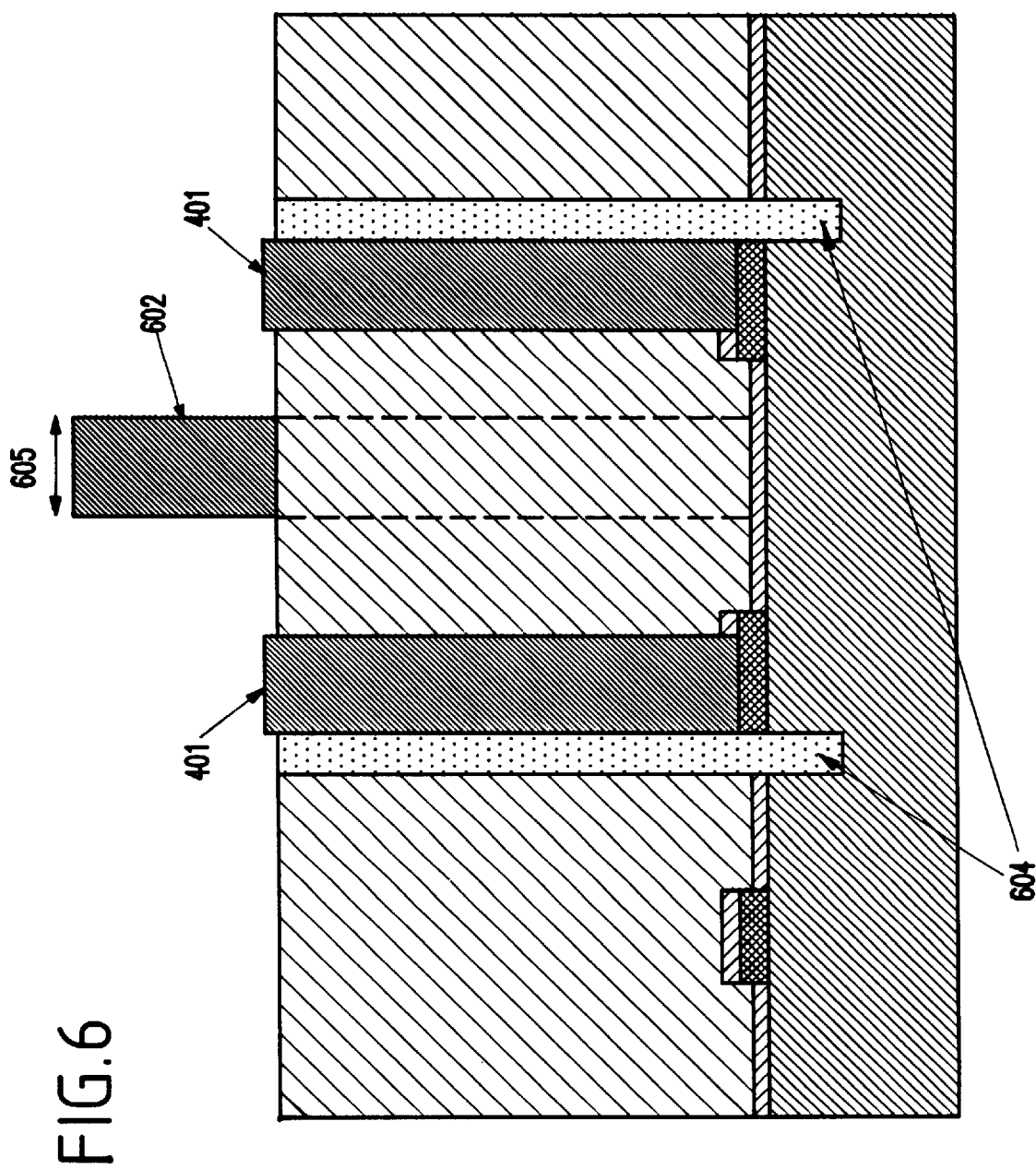
FIG. 6 is a schematic diagram of a cross sectional view of a completed depletion type transistor according to the invention.

Therefore, for depletion devices the channel region is defined by the area under the gate electrode 602, as shown in FIG. 6. Alternatively, for accumulation devices, the channel region is defined by the separation of the source and drain electrodes 103. Further, FIG. 6 illustrates that the channel length is determined by the length of the gate electrode 603. FIG. 6 also illustrate the contacts 401 for the source and drain electrodes and the isolation material (e.g., tetraethylorthosilicate TEOS) in the isolation channels.

Therefore, the Mott FET device acts in a similar manner to conventional MOSFETs in that application of voltage to the gate electrode changes the conductivity of (e.g., connects or disconnects) the source/drain. However, the invention avoids the use of any semiconductor materials (e.g., diffusion regions, etc.) and instead, relies on a Mott transition channel layer 201.

Alternatively, the gate insulator 202 could be a ferroelectric oxide (e.g., a ferroelectric capacitor). The ferroelectric capacitor 202 would maintain the charge created by the gate 402 and therefore allow the conductivity of the channel region 201 to remain in a given state (e.g., conductive or non-conductive) even after the applied voltage in the gate 402 is discontinued.

Figure 7:
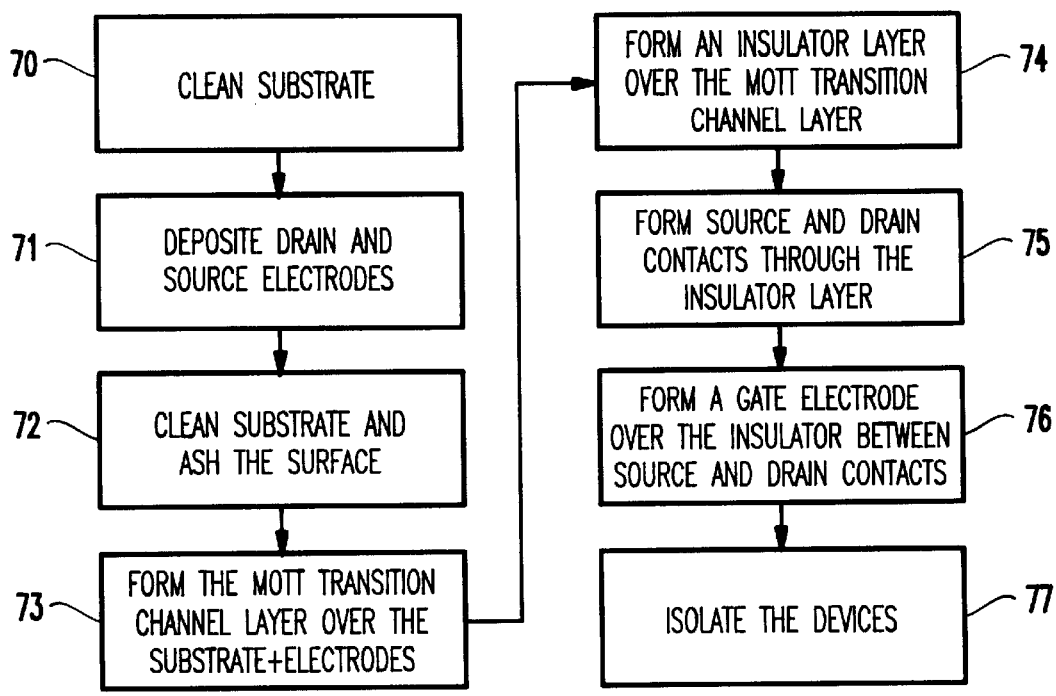
FIG. 7 is a flow diagram illustrating a preferred method of the invention.

FIG. 7 is a flowchart of an embodiment of the invention. In FIG. 7, as shown in item 70, the substrate 101 is cleaned before the Mott transition channel layer 201 is formed. As shown in item 71, the drain and source electrodes 103 are deposited. Then, the substrate 101 is cleaned and ashed, in item 72. The Mott transition channel layer 201 is then formed over the substrate 101, in item 73. Item 74 shows the insulator layer 202 being formed over the Mott transition channel layer 201. Source and drain contacts 401 are formed through the insulator layer 202, as shown in item 75. As shown in item 76, the gate conductor 402 is formed over the insulator layer 202 between the source and drain contacts 401. As shown in item 77 the isolation devices 604 are formed.

The invention produces many benefits when compared to conventional Mott FET structures. More specifically, with the invention, the Mott transition channel layer 201 is buried below the gate oxide layer 202 which protects the channel layer 201 from damage or change during subsequent processing. Also, the invention forms the channel layer 201 on a clean substrate 101 using an epitaxial growth process, which provides superior long-range order quality and fewer imperfections when compared to conventional structures. Additionally, the length of the gates channel region 203 is easily controlled with the invention during the patterning of the conductive contacts 103 and gate conductor 402.

While the invention has been described in terms of preferred embodiments, those skilled in the art will recognize that the invention can be practiced with modification within the spirit and scope of the appended claims.

What is claimed is:

1. An integrated circuit device comprising:
    a Mott transition channel layer over a substrate;
    an insulator layer over said Mott transition channel layer;
    source and drain contacts extending through said insulator layer, such that said source and drain contacts are electrically connected to said Mott transition channel layer; and
    a gate electrode over said insulator layer between said source and drain contacts.

2. The integrated circuit in claim 1, wherein said Mott transition channel layer includes source and drain electrodes electrically connected to said source and drain contacts.

3. The integrated circuit device in claim 1, wherein said Mott transition channel layer is epitaxially formed.

4. The integrated circuit device in claim 1, wherein said Mott transition channel layer comprises a perovskite oxide layer.

5. The integrated circuit device in claim 1, wherein a spacing of said source and drain contacts defines a gate channel length.

6. The integrated circuit device in claim 1, wherein an area under said gate electrode defines a channel region in said Mott transition channel layer.

7. The integrated circuit device in claim 1, wherein a conductivity of said Mott transition channel layer is adjusted by changing an oxygen content of said Mott transition channel layer.

8. A field effect transistor device comprising:
   a Mott transition channel layer over a substrate;
   an insulator layer over said Mott transition channel layer;
   source and drain contacts extending through said insulator layer, such that said source and drain contacts are electrically connected to said Mott transition channel layer; and
   a gate electrode over said insulator layer between said source and drain contacts.

9. The field effect transistor device in claim 8, wherein said Mott transition channel layer includes source and drain electrodes electrically connected to said source and drain contacts.

10. The field effect transistor device in claim 8, wherein said Mott transition channel layer is epitaxially formed.

11. The field effect transistor device in claim 8, wherein said Mott transition channel layer comprises a perovskite oxide layer.

12. The field effect transistor device in claim 8, wherein a spacing of said source and drain contacts defines a gate channel length.

13. The field effect transistor device in claim 8, wherein an area under said gate electrode defines a channel region in said Mott transition channel layer.

14. The field effect transistor device in claim 8, wherein a conductivity of said Mott transition channel layer is adjusted by changing an oxygen content of said Mott transition channel layer.

15. An integrated circuit device having at least one field effect transistor, said field effect transistor comprising:
   a Mott transition channel layer over a substrate;
   an insulator layer over said Mott transition channel layer;
   source and drain contacts extending through said insulator layer, such that said source and drain contacts are electrically connected to said Mott transition channel layer; and
   a gate electrode over said insulator layer between said source and drain contacts.

16. An integrated circuit device in claim 15, wherein said Mott transition channel layer includes source and drain electrodes electrically connected to said source and drain contacts.

17. An integrated circuit device in claim 15, wherein said Mott transition channel layer is epitaxially formed.

18. An integrated circuit device in claim 15, wherein said Mott transition channel layer comprises a perovskite oxide layer.

19. An integrated circuit device in claim 15, wherein a spacing of said source and drain contacts defines a gate channel length.

20. An integrated circuit device in claim 15, wherein an area under said gate electrode defines a channel region in said Mott transition channel layer.

21. An integrated circuit device in claim 15, wherein a conductivity of said Mott transition channel layer is adjusted by changing an oxygen content of said Mott transition channel layer.

* * * * *